(12) United States Patent
Iwai et al.

(10) Patent No.: US 6,636,543 B2
(45) Date of Patent: Oct. 21, 2003

(54) SEMICONDUCTOR DEVICE AND SURFACE EMITTING SEMICONDUCTOR LASER DEVICE

(75) Inventors: Norihiro Iwai, Tokyo (JP); Tatsuyuki Shinagawa, Tokyo (JP); Noriyuki Yokouchi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/184,442

(22) Filed: Jun. 26, 2002

(65) Prior Publication Data

US 2003/0015726 A1 Jan. 23, 2003

(30) Foreign Application Priority Data

Jun. 26, 2001 (JP) .......................................... 2001-192303
Jun. 5, 2002 (JP) .......................................... 2002-164091

(51) Int. Cl.[7] .............................. H01L 33/00; H01S 3/19
(52) U.S. Cl. ............................ 372/49; 257/79; 257/619; 257/643; 257/792
(58) Field of Search .............................. 372/49; 257/79, 257/619, 643, 792

(56) References Cited

U.S. PATENT DOCUMENTS 6,298,551 B1 * 10/2001 Wojnarowski et al. ........ 29/829

* cited by examiner

*Primary Examiner*—Jerome Jackson
(74) *Attorney, Agent, or Firm*—Knobbe Martens Olson & Bear LLP

(57) ABSTRACT

A semiconductor device including a substrate, a mesa post overlying the substrate and having a substantially cylindrical shape, a resin member surrounding the mesa post and a stress moderating member received in the mesa post for moderating stress between the mesa post and the resin member. The stress applied to the mesa post is reduced because the entire volume of the resin member is divided by the stress moderating member and each of the divided resin members reduces the stress.

4 Claims, 6 Drawing Sheets

SEMICONDUCTOR DEVICE AND SURFACE EMITTING SEMICONDUCTOR LASER DEVICE

BACKGROUND OF THE INVENTION (a) Field of the Invention

The present invention relates to a semiconductor device and a surface emitting semiconductor laser device, and more in particular to the semiconductor device and the surface emitting semiconductor laser device having a higher long-term reliability.

(b) Description of the Related Art

A surface emitting semiconductor laser device emitting light in a direction perpendicular to a substrate attracts public attention in the data communication field because of the possible arrangement of a plurality of the laser devices in a two-dimensional array on a single substrate, different from a conventional Fabry-Perot semiconductor laser device.

The surface emitting semiconductor laser device includes a pair of DBRs (Distributed Bragg Reflectors) (for example, Al(Ga)As/Ga(Al)As in the GaAs-based reflector) and an active layer acting as an emitting region sandwiched between the reflectors overlying a GaAs or InP substrate.

In order to increase the current injection efficiency and to reduce the threshold current, a surface emitting semiconductor laser device has been proposed having the current confinement structure made of an Al oxide layer.

As shown in FIG. 1, a conventional 850 nm-range surface emitting semiconductor laser device 10 includes a layer structure, overlying an n-GaAs substrate 12, having a bottom DBR mirror 14 having 35 pairs of n-$Al_{0.9}$GaAs/n-$Al_{0.2}$GaAs each having a thickness of $\lambda/4n$ ("$\lambda$" is a lasing wavelength and "n" is a refractivity), a bottom cladding layer 16, a quantum well active layer 18, a top cladding layer 20 and a top DBR mirror 22 having 25 pairs of p-$Al_{0.9}$GaAs/p-$Al_{0.2}$GaAs each having a thickness of $\lambda/4n$.

In the top DBR mirror 22, one of the layers close to the active layer 18 is formed as an AlAs layer 24 in place of the $Al_{0.9}$GaAs layer, and Al of the AlAs layer 24 in the area other than a current injection area is selectively oxidized to form a current confinement area made of an Al oxide area 25 which surrounds the current injection area.

The top DBR mirror 22 in the layer structure is configured to be a circular mesa post 23 having a diameter of 30 $\mu$m from the top to the layer near to the active layer 18 made of the photolithographic and etching process.

The current confinement area made of the Al oxide area 25 is formed around the mesa post 23 by selectively oxidizing the Al in the AlAs layer 24 inwardly from the outer periphery of the mesa post 23 by means of the oxidation treatment of the layer structure at about 400° C. in a water vapor ambient.

When, for example, the Al oxide area 25 includes an annular ring having a width of 10 $\mu$m, the surface area of the central AlAs area 24 or the surface area for the current injection (aperture) is about 802 $\mu m^2$ having a circular shape (diameter is 10 $\mu$m).

The mesa post 23 is surrounded by, for example, a polyimide section 26, and a ring-shaped electrode acting as a p-side electrode 28 is mounted in contact with the periphery of the top surface of the mesa post 23 by the width from 5 $\mu$m to 10 $\mu$m. After the thickness of the n-GaAs substrate 12 is adjusted to about 200 $\mu$m by polishing the bottom surface thereof, an n-side electrode 30 is formed thereon.

An electrode pad 32 for connection with an external terminal is mounted on the polyimide section 26 and in contact with the ring-shaped electrode 28.

In the surface emitting semiconductor laser device having the narrowed oxide area different from the current confinement structure for ion implantation, the formation of the mesa post 23 having the exposed periphery is required for the oxidation of the AlAs area in the p-type DBR mirror.

The height of the mesa post 23 or the etching depth of the top DBR mirror depends on the thickness of the top DBR mirror 22 because the periphery of the AlAs area 24 should be exposed for the oxidation.

For increasing the refractivity of the DBR mirror 22, 20 pairs or more of the compound semiconductor layers are necessary. Accordingly, the thickness of the top DBR mirror 22 amounts to about 4 $\mu$m to 5 $\mu$m.

As described earlier, the mesa post 23 is surrounded by the resin such as polyimide to flatten the step of the mesa post 23. As shown in FIGS. 2A to 2C, the mesa post 23 is entirely surrounded by the polyimide section 26.

The electrode pad 32 on the polyimide section 26 reduces the parasitic capacitance generated under the electrode pad more significantly than the electrode pad on the compound semiconductor layer, thereby providing the higher speed operation.

The surface emitting semiconductor laser device with the narrowed oxide area is frequently used for higher speed operation (modulation) because of the lower threshold current.

When the surface emitting semiconductor laser device having the mesa post surrounded by the polyimide is thermally treated at 300 to 400° C. in the device manufacturing step (wafer process) or the mounting step (package), the stress is generated between the compound semiconductor layer and the polyimide section due to the difference between the thermal expansion coefficients thereof and is applied to the mesa post, thereby exerting ill effects on the active region. This is not preferable with respect to the initial characteristics and the reliability of the surface emitting semiconductor laser device.

Also in the actual operation circumstance in which the device operates in the temperature range between 0 and 85° C., the stress generated between the polyimide section and the DBR mirror may exert ill effects on the long-term reliability of the surface emitting semiconductor laser device. Accordingly, the reduction of the stress generated between the polyimide section and the mesa post is requested.

A similar problem may arise in the surface emitting semiconductor laser device having the mesa post surrounded by the polyimide in addition to the above device having the narrowed oxide layer. Further, a similar problem may arise in a general semiconductor device including a light emitting device, a light receiving device and a transistor other than the surface emitting semiconductor laser device.

SUMMARY OF THE INVENTION

It is an object of the present invention to provide a semiconductor device and a surface emitting semiconductor laser device having a longer time of life which are obtained by reducing stress applied to a mesa post.

In a first aspect of the present invention, a semiconductor device is provided which includes a substrate, a mesa post overlying the substrate and having a substantially cylindrical shape, a resin member surrounding the mesa post and a stress moderating member received in the mesa post for moderating stress between the mesa post and the resin member.

In a second aspect of the present invention, a surface emitting semiconductor laser device is provided which includes a substrate and a layer structure formed thereon, the layer structure including a mesa post surrounded by a resin member having a stress moderating member for moderating stress between the mesa post and the resin member.

In accordance with the present invention, the stress applied to the mesa post of the semiconductor device or the surface emitting semiconductor laser device is reduced because the entire volume of the resin member is divided by the stress moderating member and each of the divided resin members reduces the stress.

The above and other objects, features and advantages of the present invention will be more apparent from the following description.

PREFERRED EMBODIMENTS OF THE INVENTION

Figure 1:
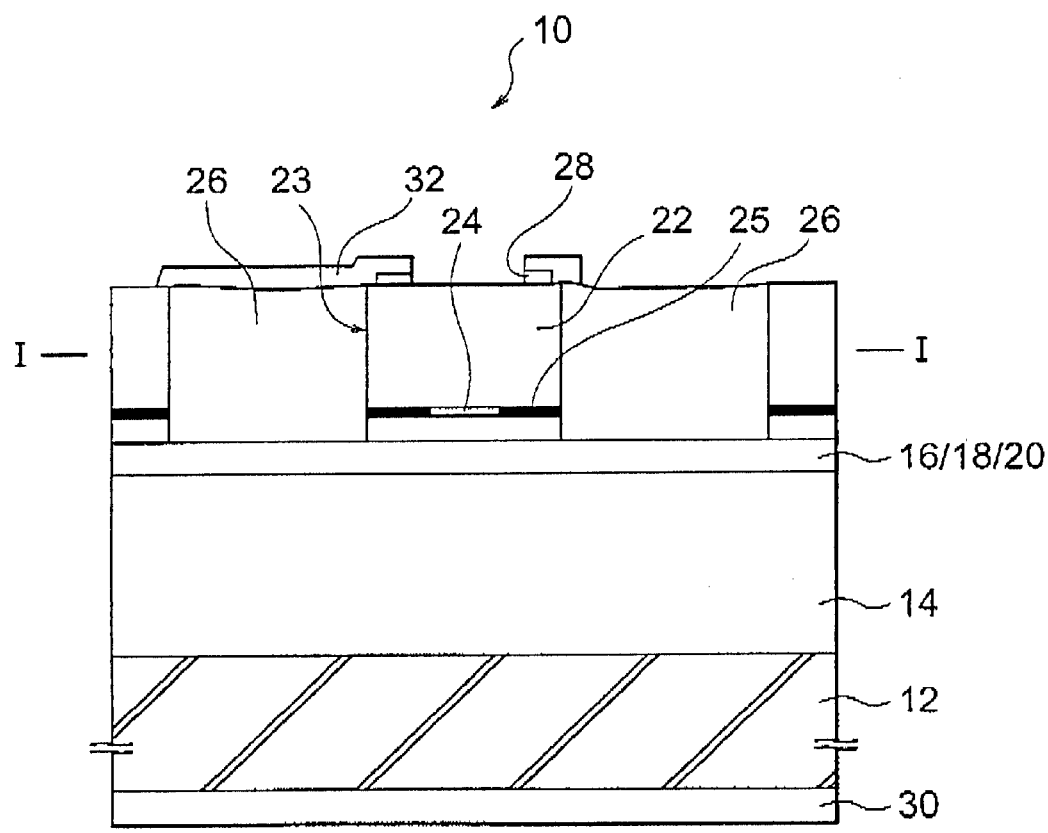
FIG. 1 is a sectional view showing a conventional surface emitting semiconductor laser device.
Figure 2A:
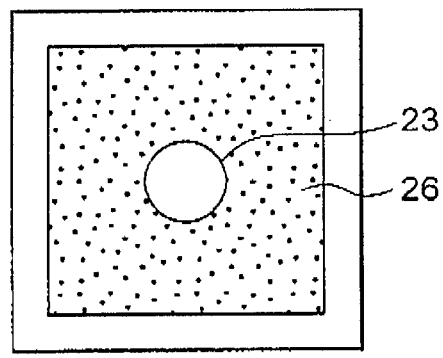
FIG. 2A is a transversal sectional view taken along a line I—I of FIG. 1.
Figure 2B:
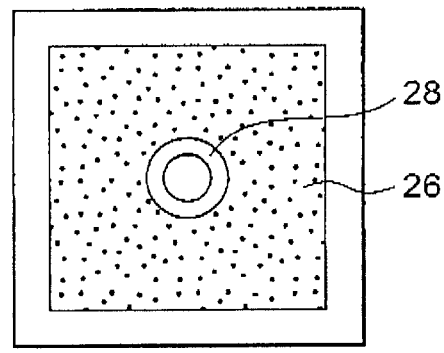
FIG. 2B is a top plan view showing a p-side electrode of FIG. 1
Figure 2C:
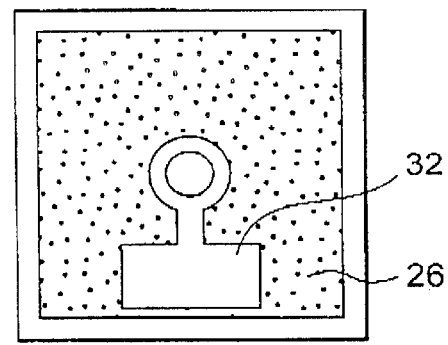
FIG. 2C is a top plan view showing an electrode pad of FIG. 3.

The present inventor has conceived that the stress applied to a mesa post is reduced by mounting at least an outward extending fin on the mesa post, thereby dividing a polyimide section around the mesa post into a plurality of the smaller sections having the smaller volumes.

It has been confirmed that, through plenty of experiments, the stress applied to the mesa post is actually reduced, and the characteristics of the surface emitting semiconductor laser device are not ill-affected provided that the width of the fin is smaller than the width of an Al oxide area.

A similar effect can be obtained when the resin member is divided by at least a separation trench in place of the fin.

The fin and the separation trench are not necessarily required to extend from the outer periphery of the mesa post to the circumference of the resin member. Although the effects obtained are more or less limited, the fin and the separation trench may extend from the outer periphery of the mesa post to the halfway of the resin member or from the halfway of the resin member to the circumference of the resin member.

The stress moderating member of the present invention refers to a part having a function of reducing the stress applied to the mesa post and the configuration thereof is not restricted so long as the above function is secured.

For example, the stress moderating member is made of a material different from that of the resin member, and more specifically made of the fin or the hollow separation trench.

The material of the fin is not restricted provided that the integrity of the resin member is weakened by forming the fin with the material different from that of the resin member.

Preferably, the resin member is made of polyimide or benzocyclobutane (BCB).

The fin and the separation trench may be formed in contact with the outer periphery of the mesa post or in contact with the circumference of the resin member.

Preferably, the fin and the separation trench are radially formed. More preferably, the fin is integrally formed with the mesa post as an extension of the mesa post, thereby fabricating the fin and the mesa post in a single step.

For example, when the structure including the mesa post is configured as a layer structure, the fin may be formed as the same layer structure as that of the mesa post. In this case, the fin having the same layer structure extends from the outer periphery of the mesa post into the resin member.

The number of the fin or the separation trench is not restricted, and preferably adjusted depending on the diameter of the mesa post and the volume of the resin member. The arrangement of the fins or the separation trenches is preferably symmetrical and radial having the mesa post as the point of symmetry for uniformly distributing the generated stress.

The shape of the mesa post is not restricted, and the section of the mesa post may be a circle, a square or triangle. The shape of the resin member is not restricted, either.

The extension shape of the fin or the separation trench may be linear, zigzag or curved. The fin or the separation trench preferably extends over the entire thickness of the resin member. The width of the fin or the separation trench depends on the distance from the outer periphery of the mesa post to the circumference of the resin member and the thickness of the resin member, and is preferably made to be smaller provided that the stress applied to the mesa post is reduced.

The present invention can be used as the semiconductor device which includes a light emitting device, a light receiving device and a transistor provided that part of the device structure is formed as the mesa post surrounded by the resin member, and specifically useful when used as the surface emitting semiconductor laser device.

In the surface emitting semiconductor laser device, an Al oxide area inwardly extends from the outer periphery of the mesa post in the multi-layer film reflector.

When, for example, the Al oxide area forms a current confinement region, the fin having the same layer structure as that of the multi-layer film reflector extends, as the extension of the mesa post, from the outer periphery of the mesa post to the circumference of the resin member to divide the resin member into the smaller areas. The thickness of the fin is smaller than the width of the Al oxide area inwardly extending from the outer periphery of the mesa post.

The characteristics of the surface emitting semiconductor laser device are not affected because the Al in the fin is oxidized to form a dielectric layer so long as the thickness of the fin is smaller than the width of the Al oxide area.

While the present invention is suitably applied to the surface emitting semiconductor laser device having the narrowed oxide area, the invention may be applied to any surface emitting semiconductor laser device having a multi-layer film reflector formed as a mesa post surrounded by a resin member.

Then, the configuration of a semiconductor laser device in accordance with embodiments of the present invention will be described referring to the annexed drawings.

Embodiment 1

Figure 3:
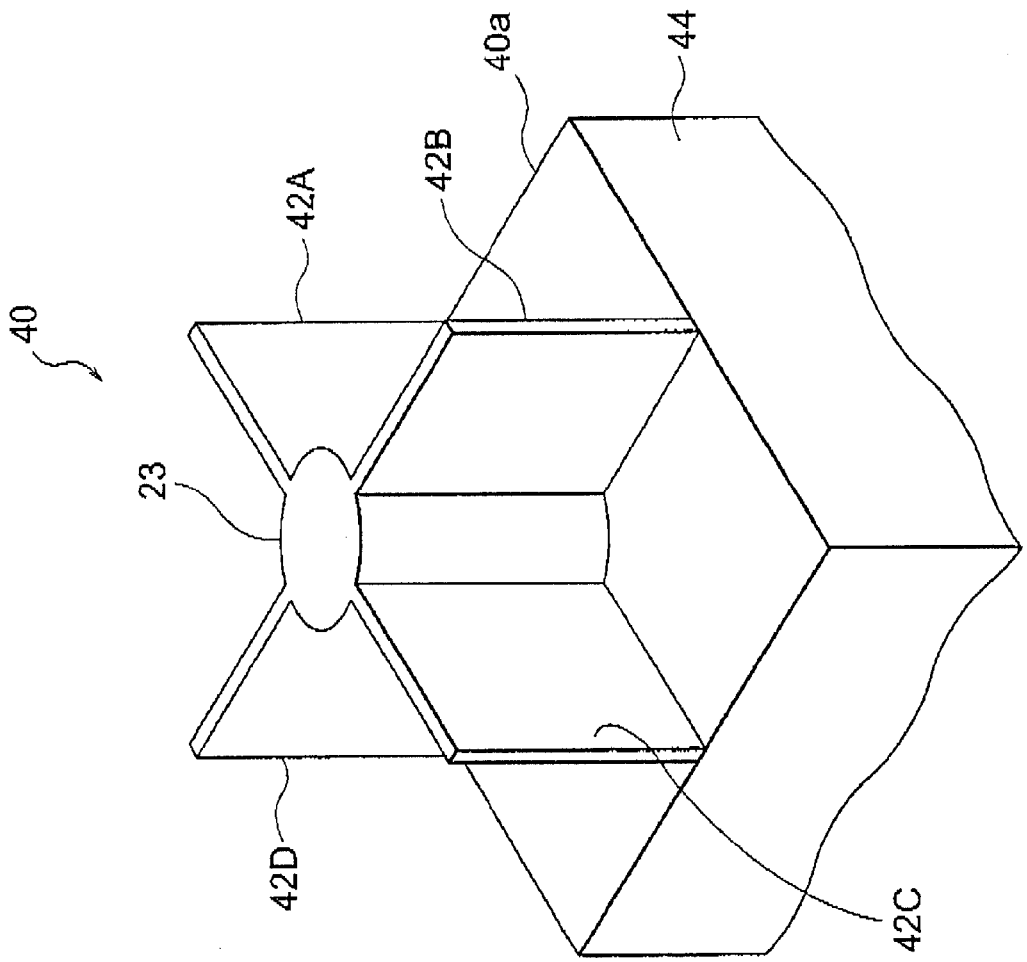
FIG. 3 is a perspective view showing the main part of a surface emitting semiconductor laser device in accordance with Embodiment 1 of the present invention.

As shown in FIG. 3, a surface emitting semiconductor laser device 40 includes substantially the same layer structure including a mesa post 23 as that of the conventional surface emitting semiconductor laser device as shown in FIG. 1, and the mesa post 23 includes four fins 42A to 42D having a width of 5 $\mu$m radially extending from the periphery of the mesa post 23 to the circumference of the laser device 40 In FIG. 3, the polyimide section surrounding the mesa post 23 is omitted.

The fins 42 radially extend on a layer structure 44 including an active layer (not shown) at a 90° interval, as an extension of the mesa post 23, from the outer periphery of the mesa post 23 through the polyimide (not shown) to a circumference section 40a perpendicular to a p-$Al_{0.9}$GaAs/p-$Al_{0.2}$GaAs multi-layer film constituting a top DBR mirror 22 (refer to FIG. 1).

Figure 4:
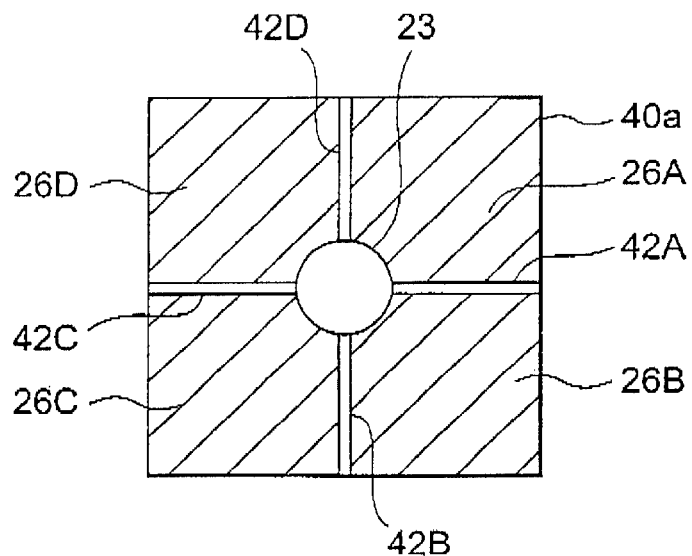
FIG. 4 is a transversal sectional view of FIG. 3.

Thereby, as shown in FIG. 4, the polyimide section surrounding the mesa post 23 is divided into four area 26A to 26D by the four fins 42A to 42D.

In this manner, the volume of the polyimide section 26 is reduced to each of the smaller volumes of the four areas 26A to 26D by the division with the four fins. Accordingly, the thermal stress generated between the mesa post 23 and the polyimide section is also reduced to decrease the stress applied to the mesa post 23 and the active region existing under the central line of the mesa post 23.

The characteristics of the surface emitting semiconductor laser device 40 are not affected by making the width of the fins 42A to 42D to be smaller than the oxide width of the AlAs area 24 (width of the Al oxide area 25) or smaller than 10 $\mu$m.

The fins 42A to 42D may be formed simultaneously with the mesa post 23. When the mesa post 23 is made of using the photolithographic and etching process, the said process is conducted so as to form the mesa post 23 having the four fins 42A to 42D.

Other than described above in connection with the fins, the surface emitting semiconductor laser device 40 of the Embodiment 1 has the substantially same configuration as that of the conventional device shown in FIG. 1 and is similarly fabricated.

Figures 5A, 5B:
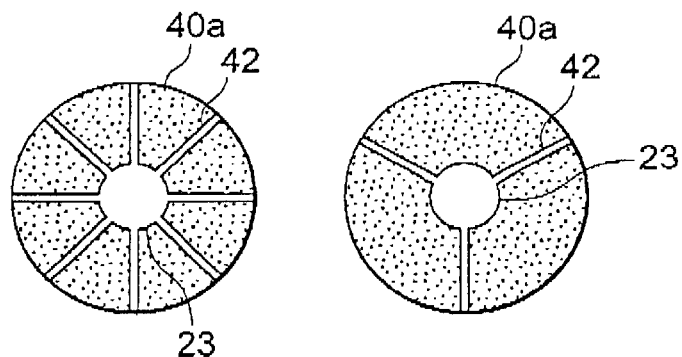
FIGS. 5A to 5C show examples of a polyimide section divided by fins.

The number of the division of the polyimide section is not restricted to four The eight division shown in FIG. 5A, and the three division shown in FIG. 5B are possible. The arrangement of the fins is preferably symmetrical having the mesa post 23 as the point of symmetry for uniformly distributing the generated stress.

Figure 5C:
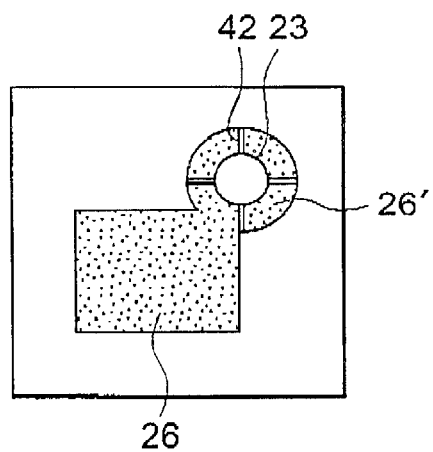

As shown in FIG. 5C, when the polyimide section 26 exists in a region different from that of the mesa post 23, fins may be formed in another polyimide section 26' surrounding the mesa post 23.

The shape of the mesa post 23 is not restricted to the circle as described in Embodiment 1, and a square or triangle shape can be used.

Embodiment 2

Figure 6:
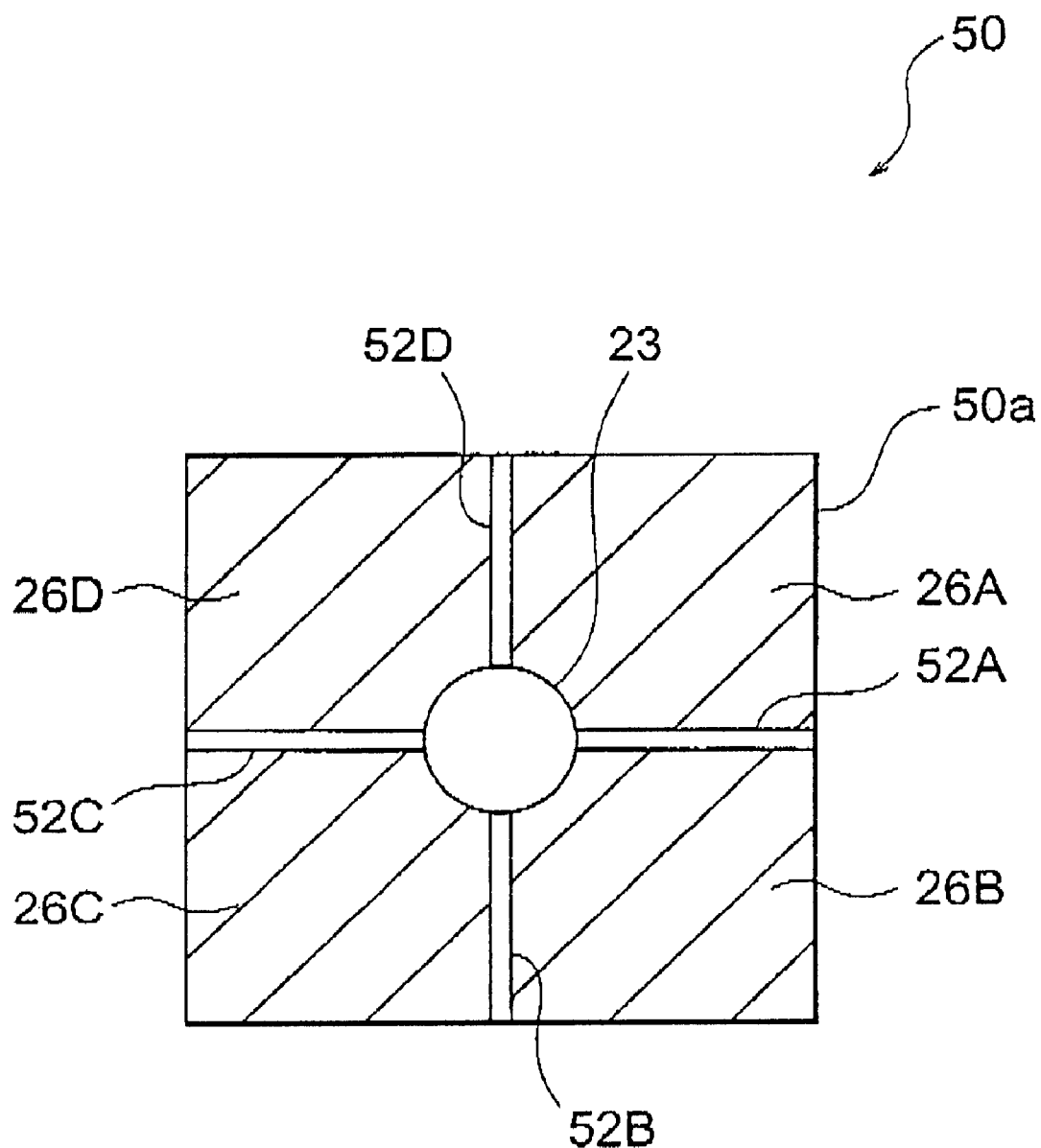
FIG. 6 is a transversal sectional view showing the configuration of fins or separation trenches of a surface emitting semiconductor laser device in accordance with Embodiment 2.

As shown in FIG. 6, a surface emitting semiconductor laser device 50 of Embodiment 2 includes substantially the same configuration as that of the surface emitting semiconductor laser device 40 of Embodiment 1 except that four separation trenches 52A to 52D are formed having a width of 5 $\mu$m radially and outwardly extending from the outer periphery of the mesa post 23 to the circumference of the laser device 50 in place of the fins 42A to 42D in Embodiment 1.

In this manner, similarly to Embodiment 1, the volume of the polyimide section 26 is reduced to each of the smaller volumes of the four areas 26A to 26D by the division with the four separation trenches 52A to 52D. Accordingly, the thermal stress generated between the mesa post 23 and the polyimide section 26 is also reduced to decrease the stress applied to the mesa post 23 and the active region existing under the central line of the mesa post 23.

Embodiments 3 to 7

Figure 7A:
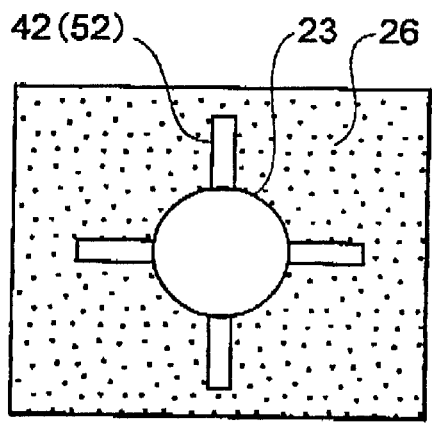
FIGS. 7A to 7E are transversal sectional views showing the exemplified configurations of fins or separation trenches of the surface emitting semiconductor laser device.

In a surface emitting semiconductor laser device of Embodiment 3 shown in FIG. 7A, four linear fins 42 or separation trenches 52 radially extend at the same 90° interval from the outer periphery of the mesa post 23 to the halfway of the polyimide section 26.

Figure 7B:
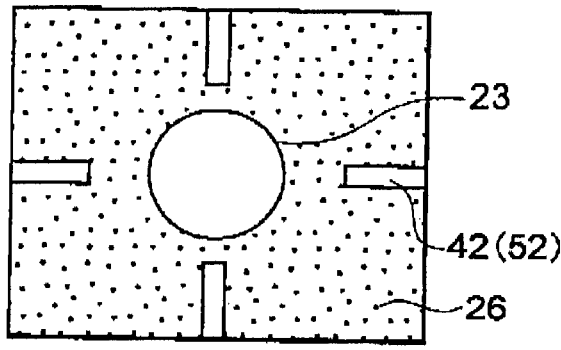

In a surface emitting semiconductor laser device of Embodiment 4 shown in FIG. 7B, four linear fins 42 or separation trenches 52 radially extend at the same 90° interval from the halfway of the polyimide section 26 to the outer periphery of the polyimide section 26.

Figure 7D:
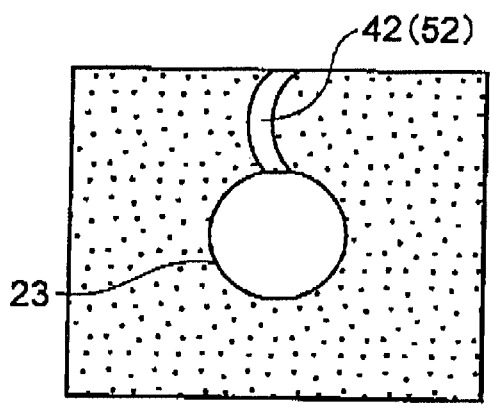
Figure 7E:
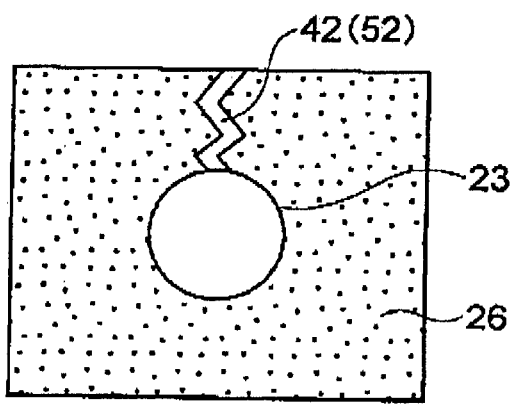
Figure 7C:
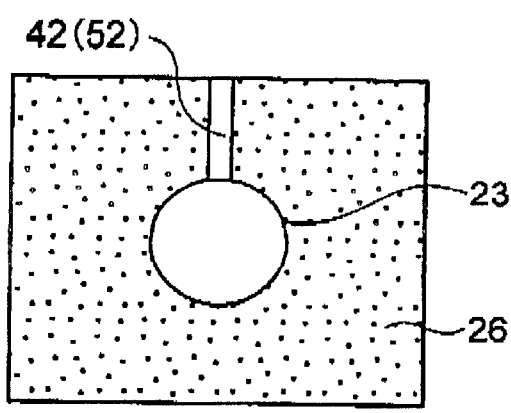

In a surface emitting semiconductor laser device of Embodiment 5 shown in FIG. 7C, one linear fin 42 or separation trench 52 extends from the outer periphery of the mesa post 23 to the circumference of the polyimide section 26 to divide the polyimide section into two.

In a surface emitting semiconductor laser device of Embodiment 6 shown in FIG. 7D, one curved fin 42 or separation trench 52 extends from the outer periphery of the mesa post 23 to the circumference of the polyimide section 26 to divide the polyimide section into two.

In a surface emitting semiconductor laser device of Embodiment 7 shown in FIG. 7E, one zigzag fin 42 or separation trench 52 extends from the outer periphery of the mesa post 23 to the circumference of the polyimide section 26 to divide the polyimide section into two.

In the surface emitting semiconductor laser devices of Embodiments 3 to 7, the fins 42 are made of the compound semiconductor multi-layer film having the same layer structure as that of the mesa post 23. Accordingly, the fins 42 and the mesa post 23 can be formed in a single formation step.

However, the fins 42 and the mesa post 23 are not necessarily required to be made of the compound semiconductor multi-layer film having the same layer structure. The fins 42 may be made of a material different from the polyimide, or the surrounding section is made of a material different from the material of the mesa post 42 to provide the fins 42.

Although the height of the fins 42 is not required to be the same as the height of the mesa post 23, both of the heights are preferably the same in view of the surface processability and the stress moderating efficiency.

Since the above embodiment is described only for examples, the present invention is not limited to the above embodiment and various modifications or alterations can be easily made therefrom by those skilled in the art without departing from the scope of the present invention.

What is claimed is:

1. A surface emitting semiconductor laser device comprising a substrate and a layer structure formed thereon, the layer structure including a mesa post which comprises multi-layer film reflector and which is surrounded by a resin member having a stress moderating for moderating stress between the mesa post and the resin member.

2. The surface emitting semiconductor laser device as defined in claim 1, wherein an Al oxide area extends from a periphery of the mesa post to an inner part within or in vicinities of the multilayer film reflector formed in part of the mesa post.

3. The surface emitting semiconductor laser device as defined in claim 2, wherein the Al oxide area forms a current confinement region.

4. The surface emitting semiconductor laser device as defined in claim 2, wherein a thickness of the fin is smaller than a width of the Al oxide area.

* * * * *

UNITED STATES PATENT AND TRADEMARK OFFICE
CERTIFICATE OF CORRECTION

PATENT NO. : 6,636,543 B2
DATED : October 21, 2003
INVENTOR(S) : Iwai et al.

It is certified that error appears in the above-identified patent and that said Letters Patent is hereby corrected as shown below:

Column 6,
Line 64, which reads, "moderating for", should read -- moderating member for --.

Column 7,
Line 2, which reads , "multilayer", should read -- multi-layer --.

Signed and Sealed this

First Day of June, 2004

JON W. DUDAS
*Acting Director of the United States Patent and Trademark Office*